United States Patent [19]

Suzuki et al.

[11] Patent Number: 4,464,587
[45] Date of Patent: Aug. 7, 1984

[54] COMPLEMENTARY IGFET SCHMITT TRIGGER LOGIC CIRCUIT HAVING A VARIABLE BIAS VOLTAGE LOGIC GATE SECTION

[75] Inventors: Yasoji Suzuki, Yokosuka; Kenji Matsuo, Kawasaki, both of Japan

[73] Assignee: Tokyo Shibaura Denki Kabushiki Kaisha, Japan

[21] Appl. No.: 295,825

[22] Filed: Aug. 24, 1981

[30] Foreign Application Priority Data

Oct. 14, 1980 [JP] Japan ............................. 55-143320
Oct. 14, 1980 [JP] Japan ............................. 55-143324

[51] Int. Cl.³ .................... H03K 3/037; H03K 3/356; H03K 19/094
[52] U.S. Cl. ................................... 307/279; 307/290; 307/451
[58] Field of Search ............... 307/279, 290, 443, 451, 307/452, 453, 468, 469, 481, 576, 579, 585

[56] References Cited

U.S. PATENT DOCUMENTS 3,524,077 8/1970 Kaufman ......................... 307/453 X
3,651,342 3/1972 Dingwall ........................... 307/585
3,737,673 6/1973 Suzuki ............................... 377/79 X
3,769,523 10/1973 Suzuki ............................... 307/451
3,873,856 3/1975 Gerlach et al. .................... 307/279
3,904,888 9/1975 Griffin et al. ....................... 307/451
3,914,702 10/1975 Gehweiler ............................ 330/13
3,984,703 10/1976 Jorgensen ....................... 307/290 X Primary Examiner—Larry N. Anagnos
Attorney, Agent, or Firm—Finnegan, Henderson, Farabow, Garrett & Dunner

[57] ABSTRACT

A logic gate section of a Schmitt trigger circuit has first and second nodes to which variable bias voltages are applied. A first bias control IGFET is connected between the first node and a first potential terminal. A second bias control IGFET is connected between the first node and a second potential terminal. A third bias control IGFET is connected between the second node and the first potential terminal. A fourth bias control IGFET is connected between the second node and the second potential terminal. A control signal to the gates of the first and fourth bias control IGFET's is provided by the Schmitt trigger input signal and the control signal to each of the gates of the third and fourth bias control IGFET's is provided by the Schmitt trigger feedback connection of two series-connected inverters.

1 Claim, 24 Drawing Figures

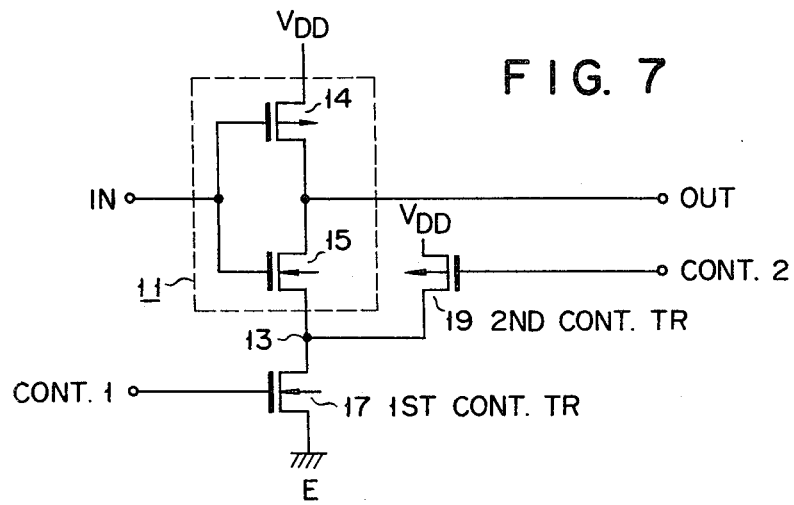
FIG. 7
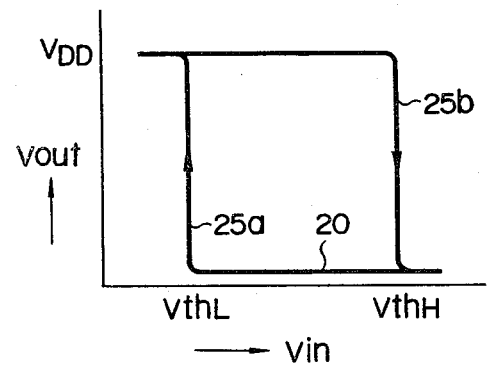
FIG. 8
FIG. 9
PRIOR ART
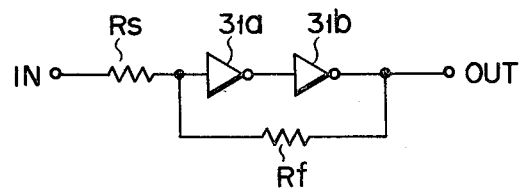
FIG. 10
PRIOR ART

OUT IN FIG. 9
(WITH OUT Rs, Rf)

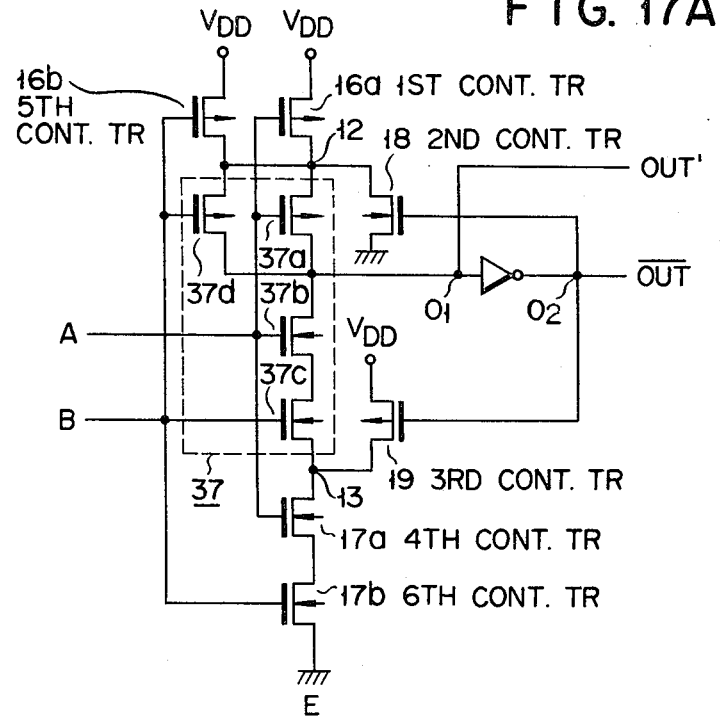
FIG. 17A
FIG. 17B
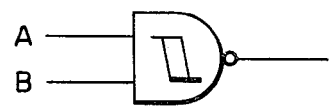
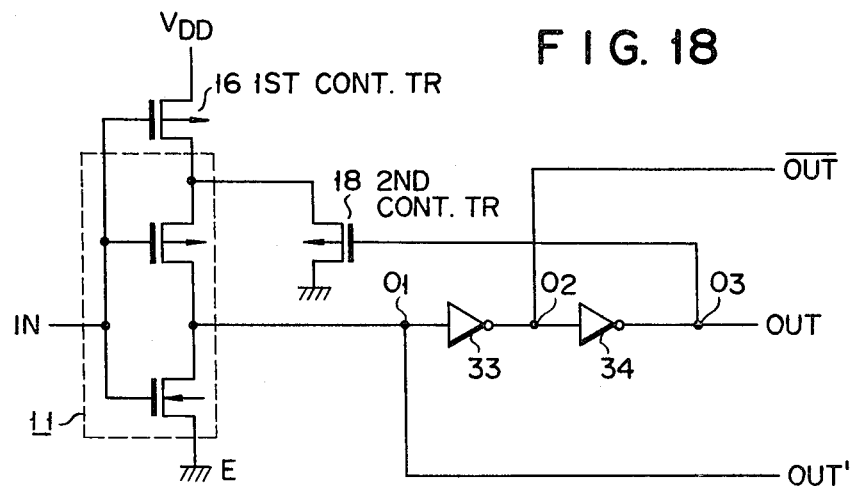
FIG. 18

COMPLEMENTARY IGFET SCHMITT TRIGGER LOGIC CIRCUIT HAVING A VARIABLE BIAS VOLTAGE LOGIC GATE SECTION

BACKGROUND OF THE INVENTION

The present invention relates to a logic circuit with a logic gate section which is constructed of IGFET's (insulated gate field effect transistors) and is able to change a bias voltage properly.

A logic circuit as an amplifier which is comprised of CMOS (complementary metal oxide silicon) transistors and has a structure as shown in FIG. 1 is disclosed in U.S. Pat. No. 3,914,702. In the logic circuit, bias voltages at nodes 2 and 3 are controlled by a control signal applied to a control terminal 1. In FIG. 1, reference numerals 5 and 6 designate P-channel type IGFET's (referred to merely as transistors) and numerals 7 and 8 N-channel type IGFET's. The transistors 6 and 7, making up an inverter IN, are connected at the gates to an input terminal 9. The output of the inverter IN is connected to an output terminal 10. In the logic circuit, even a slight change of the voltage at the control terminal 1 causes a gm ratio (conductance ratio) of the transistors 5 and 8 to change. Therefore, voltages at the nodes 2 and 3 change greatly. Therefore, with the voltage change at the control terminal 1, a potential at an operating point (a center in an input amplitude) of the inverter IN changes. Further, since the control signal is supplied only from the control signal terminal 1, an amplitude of the output from the inverter IN is limited.

SUMMARY OF THE INVENTION

Accordingly, an object of the present invention is to provide a logic circuit which can overcome the above-mentioned disadvantages by controlling bias voltages at bias voltage control nodes in a logic gate section constructed of a plurality of IGFET's, by means of a plurality of bias control IGFET's.

According to one aspect of the present invention, there is provided a logic circuit with a variable bias voltage logic gate section comprising: a logic gate section comprised of a plurality of IGFET's (insulated gate field effect transistors) having at least one input terminal and an output terminal, and first and second nodes to which variable bias voltages are applied; a first bias control IGFET connected between the first node and a first potential terminal; a second bias control IGFET connected between the first node and a second potential terminal; a third bias control IGFET connected between the second node and the first potential terminal; a fourth bias control IGFET connected between the second node and the second potential terminal; and means for applying a control signal to each of the gates of the first to fourth bias control IGFET's so as to apply a given bias voltage between the first and second potential terminals to each of the first and second nodes.

Another aspect of the present invention, there is provided a logic circuit with a variable bias voltage logic gate section comprising: a logic gate section having at least one input terminal, an output terminal, a node to which a variable bias voltage is applied, and a plurality of IGFET's (insulated gate field effect transistors); a first bias control IGFET connected between the node and a first potential terminal; a second bias control IGFET connected between the node and a second potential terminal; and means for applying a control signal to each of the gates of the first and second bias control IGFET's so as to apply a given bias voltage between the first and second potential terminals to the node.

BRIEF DESCRIPTION OF THE DRAWINGS

FIGS. 2 to 7 show circuit diagrams of first to sixth embodiments of a logic circuit according to the present invention, respectively;

FIG. 8 is a graphical representation of a Schmitt characteristic illustrating an input vs. output relation of a Schmitt circuit;

FIGS. 9 to 12 are circuit diagrams useful in explaining briefly prior art Schmitt circuits;

FIGS. 17A and 17B show a circuit diagram of a tenth embodiment of a logic circuit according to the present invention and a symbol for the circuit, respectively; and FIGS. 18, 19 and 20 are circuit diagrams of eleventh to thirteenth embodiments of a logic circuit according to the present invention, respectively.

DETAILED DESCRIPTION OF THE PREFERRED EMBODIMENTS

Figure 2:
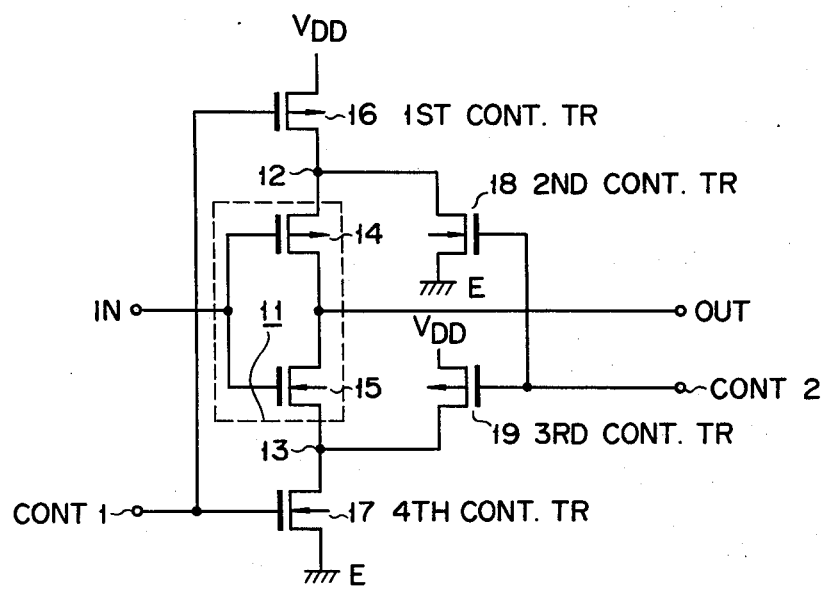

Referring to FIG. 2, an inverter 11 is comprised of a P type transistor 14 and an N type transistor 15, of which the source-drain paths are connected in series, and has an input terminal IN and an output terminal OUT. The source of the transistor 14 is coupled with a first node 12 for applying a variable bias voltage to the inverter 11 and the source of the transistor 15 is coupled with a second node 13 for applying a variable bias voltage to the inverter 11. Inserted between the first node 12 and a first potential supply terminal $V_{DD}$ is a source-drain path of a first bias control transistor 16 of P type. Inserted between the second node 13 and a second potential supply terminal E is a source-drain path of a fourth bias control transistor 17 of N type. A source-drain path of a second bias control transistor 18 of N type is further interposed between the first node 12 and the second potential terminal E. A source-drain path of a third bias control transistor 19 is similarly connected between the second node 13 and the first potential terminal $V_{DD}$. A first control signal is applied through a control terminal CONT 1 to the gates of the transistors 16 and 17. A second control signal is applied through a control terminal CONT 2 to the gates of the transistors 18 and 19.

Figure 1:
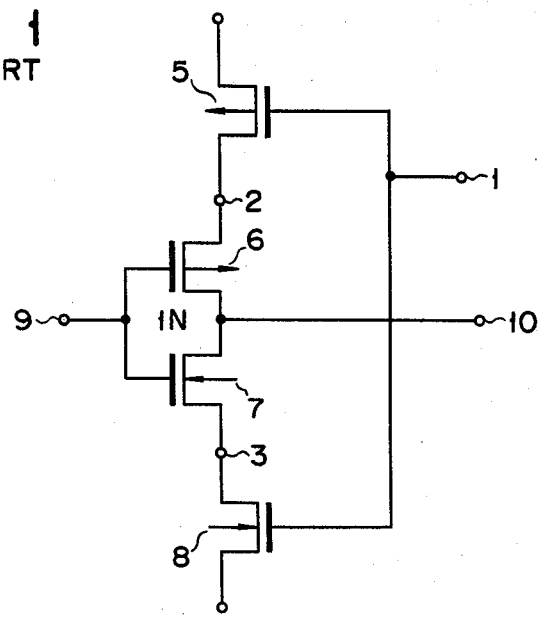
FIG. 1 shows a circuit diagram of a prior art logic circuit including a logic gate section capable of changing a bias voltage.

In FIG. 2, voltages at the control terminals CONT 1 and CONT 2 are selected such that the gm (conductance) ratio of the transistors 16 and 18 is 1:4 when the voltage at the node 12 is 4 V, for example, (assuming that the first potential $V_{DD}$ is 5 V), and that the gm ratio of the transistors 17 and 19 is 1:4 when the voltage at the node 13 is 1 V, for example. A maximum value and a minimum value of the bias voltage of each of the nodes 12 and 13 is determined by changing the gm ratios. Accordingly, within a range of the bias voltage, an oscillating output corresponding to an oscillation at the input terminal IN is derived from the output terminal OUT. Further, since the bias voltages of the nodes 12 and 13 are determined by the gm ratios of the transistor pairs 16 and 18, and 17 and 19, the bias voltages at the nodes 12 and 13 are not influenced by a voltage variation at the control terminals CONT 1 and CONT 2. Obviously, an output OUT more stable than that of FIG. 1 is obtained. Further, the bias voltages at the nodes 12 and 13 can be adjusted through the control terminals CONT 1 and CONT 2 over a wide range. Therefore, the amplitude of the output signal at the output terminal OUT can be controlled widely and further the amplitude of the output signal can simultaneously be expanded and compressed in both directions with respect to an operating point. In other words, the output signal at the output OUT can be expanded and compressed as in the case of an amplitude modulation.

Figure 3:
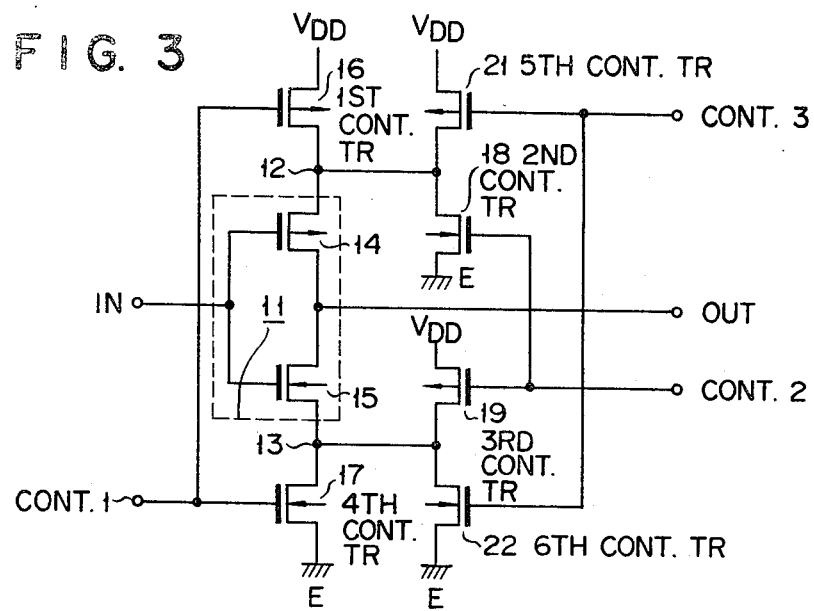

An embodiment shown in FIG. 3 additionally uses a control terminal CONT 3 for controlling the bias voltage of the inverter 11 of the embodiment shown in FIG. 2. To be more specific, a fifth P-type bias control transistor 21 is connected between the first node 12 and the first potential terminal $V_{DD}$. A sixth N-type transistor bias control transistor 22 is connected between the second node 13 and the second potential point E. The gates of the transistors 21 and 22 are connected to the third control terminal CONT 3. The bias voltages at the nodes 12 and 13 may be controlled further accurately in the present embodiment.

Figure 4:
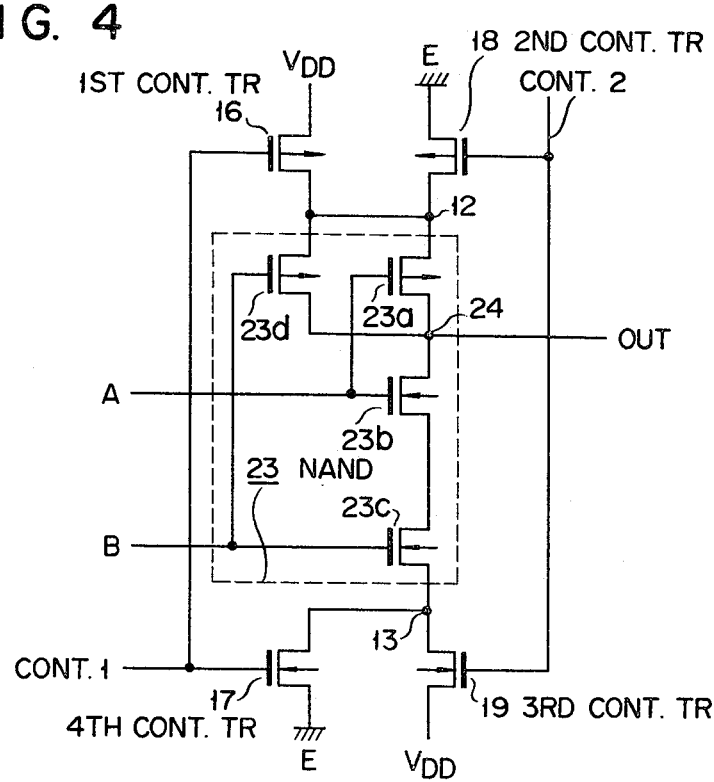

A third embodiment shown in FIG. 4 adopts an NAND gate 23 in place of the inverter 11 of the first embodiment shown in FIG. 2. P type transistors 23a and 23d are coupled in parallel between the output terminal 24 of the NAND gate 23 and the first node 12, and N type transistors 23b and 23c are connected in series between the output terminal 24 and the second node 13. In the circuit arrangement, first input signal A is applied to the gates of the transistors 23a and 23b. A second input signal B is applied to the gates of the transistors 23c and 23d. The input signals A and B are NANDed by the NAND gate 23 and the NANDed output is produced from the output terminal 24. Nothing is changed in the connection of the first and second bias control transistors 16 and 18 to the first node 12, the connection of the third and fourth bias control transistors 19 and 17 to the second node 13, and the supplying means of the control signals to the first to fourth bias control transistors, when compared with those in FIG. 2.

Figure 5:
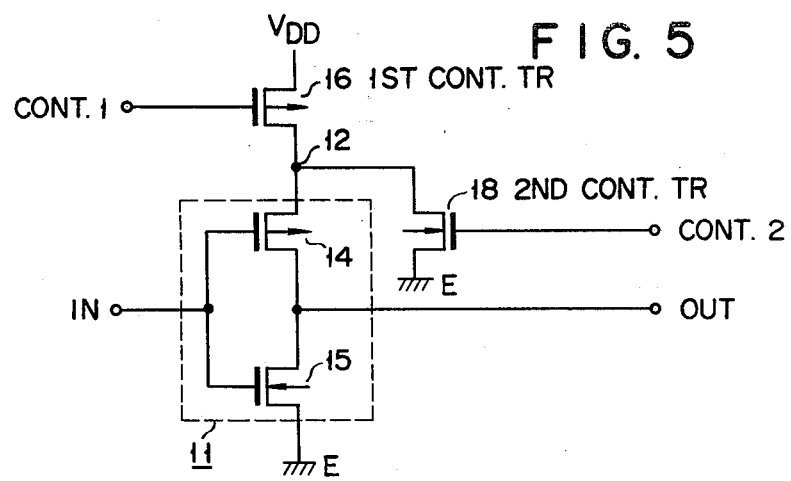

A fourth embodiment shown in FIG. 5 is distinguished from the first embodiment in that the fourth bias control transistor 17 of the first embodiment is omitted and the N type transistor 15 of the inverter 11 is directly connected at the source to the second potential terminal E and the P type bias control transistor 19 is omitted. The gate of the first bias control transistor 16 is connected to the control terminal CONT 1, and the gate of the second bias control transistor 18 is connected to the control terminal CONT 2. The inverter 11 of FIG. 5 is designed as a low-level control type inverter which can control the threshold voltage of an input voltage to a low level. In FIG. 5, the second bias control transistor 18 may be substituted by a P type transistor.

Figure 6:
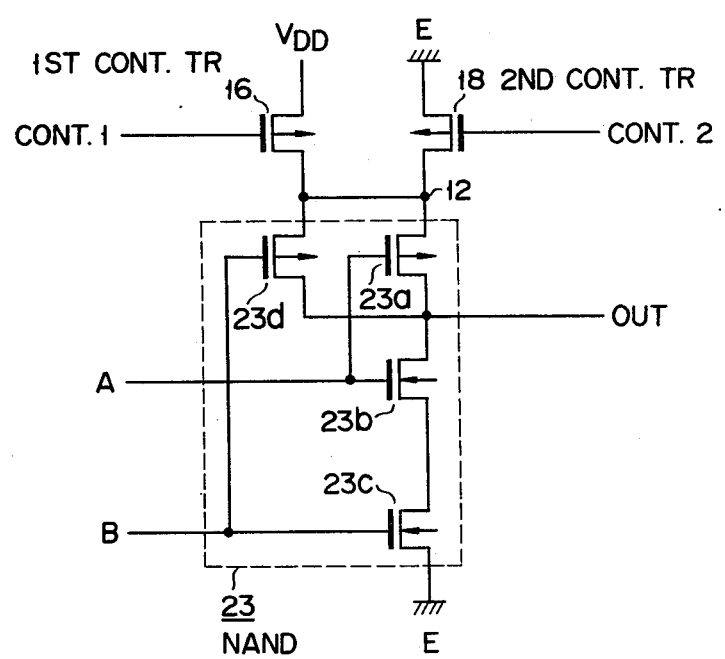

A fifth embodiment shown in FIG. 6 has a feature that the transistors 17 and 18 in FIG. 4 are omitted and the NAND gate 23 in FIG. 4 is replaced by a 2-input NAND gate of the low level bias control type. In FIG. 6, the second bias control transistor 18 may be replaced by an N type transistor.

A sixth embodiment shown in FIG. 7 is so designed that the first and second bias control transistors 16 and 18 in FIG. 2 are omitted and the inverter 11 in FIG. 2 is substituted by a high level bias control type inverter 11. In FIG. 7, the bias control transistor 19 may be replaced by an N type transistor. In the present embodiment, the potential terminals E and $V_{DD}$ serve as first and second potential terminals, and the transistors 17 and 19 serve as first and second bias control transistors.

It is evident that the embodiments shown in FIGS. 2 to 7 are not limited to those illustrated and described. The embodiments each employ CMOS type (a pair of complementary IGFET's type) logic gates. The use of a combination of the those transistors having no CMOS structure is of course allowed for the logic gate. For example, the inverter 11 may be so modified that the transistor 14 is connected at the gate to the source or the drain in the form of a load transistor, the transistor 15 is used as a driving transistor, and the remaining transistors are arranged as shown in FIG. 2. Also in FIG. 2, the transistor pair 14 and 16 may be relaced by the transistor pair 15 and 17 in the arrangement. Further, in FIG. 3, for example, the transistor pairs 18 and 21, and 19 and 22, may be a combination of those transistors having no CMOS structure, the transistor 18 may be of the P type and the transistor 19 may be of the N type. In this case, the voltages applied to the transistors 18 and 19 must be selected appropriately. In FIG. 2, the transistors 16 to 19 may each be constructed of a plurality of transistors.

In all of those embodiments shown in FIGS. 2 to 7, the output operating points in the logic circuit can be stabilized and the control range of the output amplitude can be expanded.

The explanation to follow regards an embodiment in which a logic circuit according to the present invention is applied to a threshold voltage control type amplifier which is operable equivalently to a Schmitt trigger circuit, that is a logic circuit of which the inverting threshold level is controllable.

Figure 11:
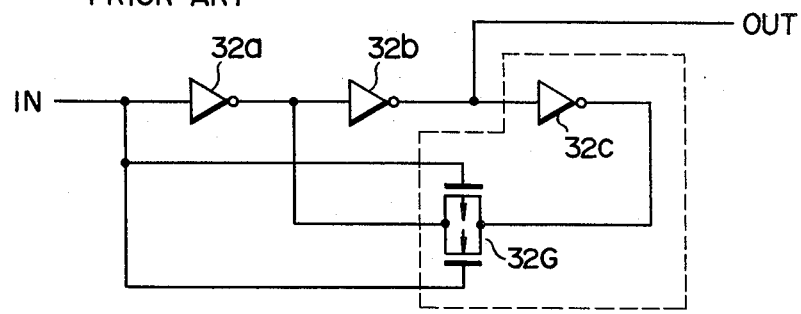
Figure 12:
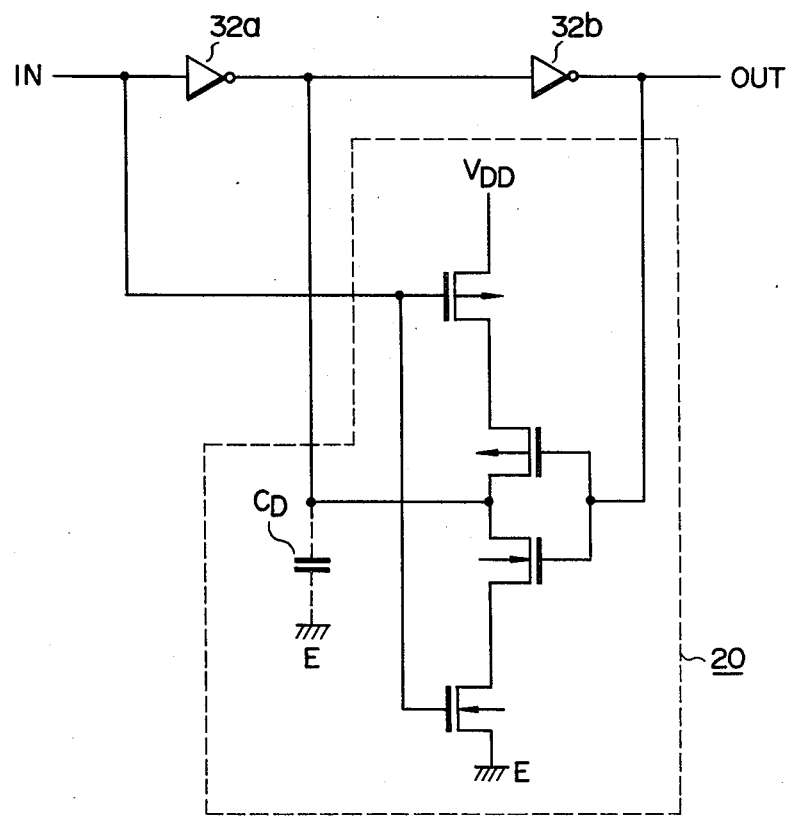

Generally, a Schmitt trigger circuit has an input vs. output characteristic as shown in FIG. 8. As shown, at a first input point VthL, the output Vout of the trigger circuit changes from a reference level 20 to the output $V_{DD}$ in a direction of an arrow 25a. At a second input point VthH, the output Vout changes from the output $V_{DD}$ to the reference level 20 in a direction of an arrow 25b. Known Schmitt trigger circuits are those as shown in FIGS. 9 to 12. In FIG. 9, reference numerals 31a and 31b are inverters, Rs and Rf are respectively resistors for determining the high threshold voltage VthH and the low threshold voltage VthL in FIG. 8. Generally, a variation in the resistances of the resistors Rs and Rf are relatively large in the manufacturing stage. Therefore, a variation in the input impedance of the Schmitt circuit is also great. The influence of those variations on the threshold levels is very large, so that the Schmitt characteristic, i.e. the hysteresis characteristic shown in FIG. 8, is deteriorated. The Schmitt trigger circuit shown in FIG. 10 is so designed that the threshold voltages VthL and VthH shown in FIG. 8 are shifted by using a resistor Rp inserted between the power source $V_{DD}$ and the input terminal of the inverter 31a. The threshold voltages VthL and VthH are influenced by the input impedances, like the circuit in FIG. 9. In a Schmitt trigger circuit shown in FIG. 11 having an arrangement of the inverters 32a to 32c and a transmission gate 32G as shown in the drawing, the input IN is directly connected to the gates of the inverter 32a and the transmission gate 32G, not through a resistor, so as to prevent the threshold voltages from being influenced by the input impedances due to the resistor. In this arrangement, however, a back gate bias effect of the transmission gate 32G influences the threshold voltages VthL and VthH. A stray capacitance produced in the source or drain of the transmission gate 32G is large. Therefore, this arrangement is not suitable for the application of a high speed operation. A conventional Schmitt trigger circuit shown in FIG. 12 is such that the inverter 32c and the transmission gate 32G shown in FIG. 11 is substituted by a circuit 20 having a function equivalent to that of the combination of them. This Schmitt trigger circuit is inappropriate to high speed operation, because the stray capacitor $C_d$ is large.

Figure 13:
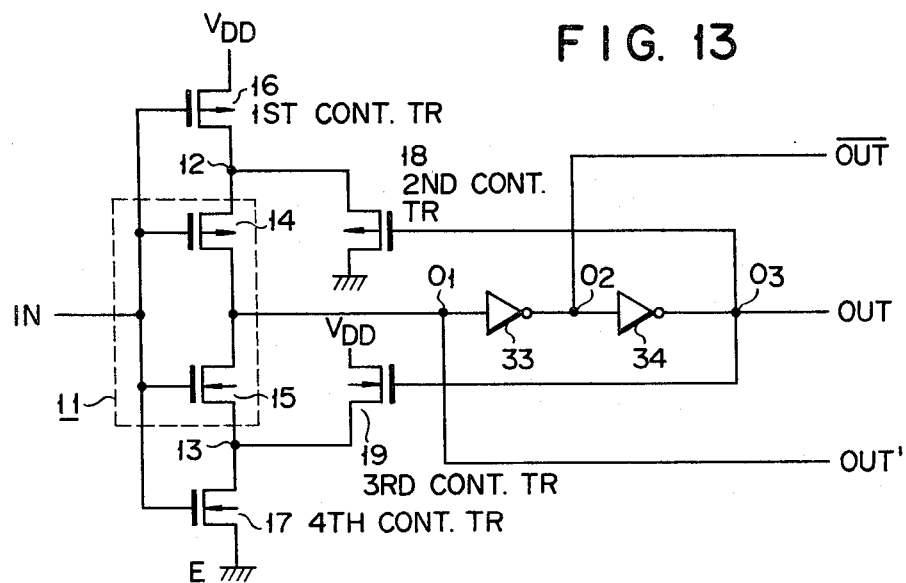
FIG. 13 shows a circuit diagram of a seventh embodiment of a logic circuit according to the present invention, which is used as a Schmitt circuit.

According to the present invention, a Schmitt trigger circuit can be realized which is free from the influence of the threshold voltage levels VthL and VthH due to the input impedances, and has a reduced stray capacitance. FIG. 13 shows such a trigger circuit, and FIGS. 15A, 16, 17A, 18 to 20 show logic circuits able to change the threshold voltages of the outputs, respectively. In FIG. 13, like reference symbols are applied to transistors corresponding to those in FIG. 2 and no explanation of them is given. In the figure, the transistors 16, 14 and 18 are of the P type. The transistors 15, 17 and 19 are of the N type. The transistors 16, 18, 19 and 17 are first to fourth bias control transistors, respectively. The input IN is commonly supplied to the gates of the transistors 14 to 17. The input of a load inverter 33 is connected to the output terminal $0_1$ of the inverter 11. The input of the load inverter 33 is connected to the output terminal $0_2$ of the load inverter 33. The output OUT is derived from the output terminal $0_3$ of the inverter 34. The output terminal $0_3$ is connected to the gates of the bias control transistors 18 and 19. The outputs OUT' and $\overline{OUT}$ are derived from the output terminals $0_1$ and $0_2$, respectively.

Figure 14A:
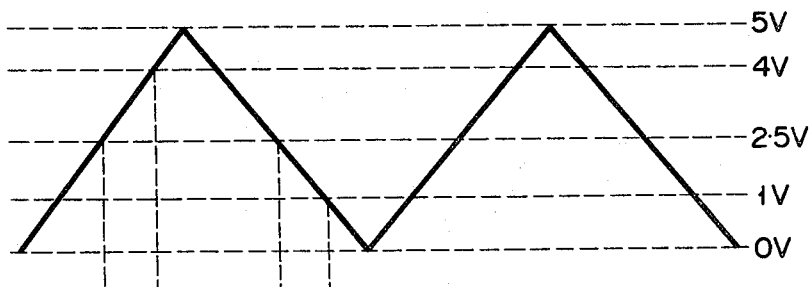
FIGS. 14A to 14B are waveforms of input and output signals of the Schmitt circuit shown in FIG. 13.
Figure 14B:
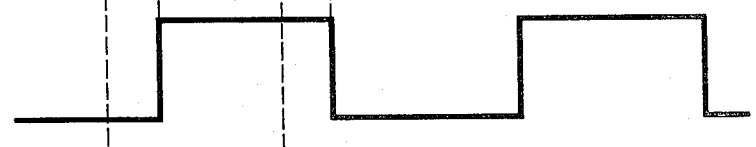
Figure 14C:
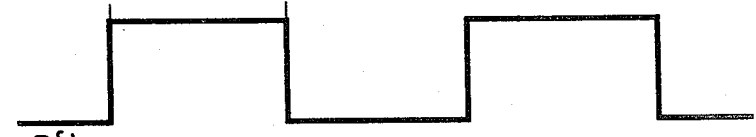
FIG. 14C is a waveform of an output of a Schmidt circuit which is a modification of the Schmidt circuit shown in FIG. 9.

The operation of the Schmitt circuit shown in FIG. 13 will be described referring to FIGS. 14A and 14B. It is assumed that the conductances gm of the bias control transistors 16, 18, 17 and 19 are selected such that the inverting threshold voltages VthH and VthL in FIG. 1 are 4 V and 1 V, respectively. It is further assumed that the input IN to the Schmitt circuit has a repetitive triangle waveform rising from 0 V to 5 V and falling off from 5 V to 0 V, as shown in FIG. 14A. FIG. 14B shows a waveform of a voltage at an output point $0_2$ in FIG. 13.

When the input IN is at 0 V, the transistor 14 in the inverter 11 and the first bias control transistor 16 is in ON stage; 5 V ($=V_{DD}$) appears at the node 12 and the output point $0_1$ of the inverter 11; 0 V appears at the output point $0_2$ of the load inverter 33; 5 V appears at the output point $0_3$ of the load inverter 34 or the OUT. At this time, the transistor 15 of the inverter 11 and the fourth bias control transistor 17 are in OFF state, but the third bias control transistor 19 receives the output OUT (=5 V) at the gate. Accordingly, the transistor 19 is in ON state and the potential at the node 13 has been risen up to $V_{DD}$−Vth19 (where Vth19 is the threshold voltage of the third bias control transistor 19).

When the voltage IN rises to 2.5 V, for example, the inverter transistor 15 and the fourth bias control transistor 17 becomes ON. At this time, however, the node 13 is held at $V_{DD}$−Vth, or approximately $V_{DD}$. As a consequence, the output terminal $0_1$ maintains approximately 5 V. Therefore, the load inverters 33 and 34 are not inverted.

When the voltage at the input IN further rises to 4 V, the ON resistance of the fourth bias control transistor 17 reduces approximately to a minimum, and therefore the voltage of the node 13 approximates to 0 V, and the voltage at the output terminal $0_1$ also approximates to 0 V. The result is the logical inversion of the load inverters 33 and 34. See FIG. 14A.

When the voltage at the input IN rises to 5 V, the voltage at the node 13 and the output $0_1$ are both 0 V; the voltage at the output terminal $0_2$ is 5 V; the voltage at the OUT is 0 V. At this time, the inverter transistor 14 and the first bias control transistor 16 are in OFF state, but the second bias control transistor 18 is in ON state. Accordingly, the voltage at the node 12 has fallen up to $|Vth18|(\approx 0$ V) of the threshold voltage of the second bias control transistor 18.

When the voltage at the input IN falls to 2.5 V, the first bias control transistor 16 and the inverted transistor 14 are in ON state. The second bias control transistor 18, however, is in ON state, so that the output terminal $0_1$ is maintained at 0 V. Consequently, the load inverters 33 and 34 keep their state, i.e. are not inverted.

When the voltage at the input IN drops up to 1 V, the ON resistance of the first bias control transistor 16 become minimal. Accordingly, the voltage at the node 12 is approximately 5 V. Since the inverter transistor 14 is in ON state, the output terminal $0_1$ is approximately at 5 V. As a result, the load inverters 33 and 34 are inverted. See FIG. 14B.

In the Schmitt circuit shown in FIG. 13, the input impedance as seen from the input IN side is infinitive. This implies that the Schmitt characteristic of the circuit depends solely on the characteristics of the transistors making up the Schmitt circuit. Therefore, a desired Schmitt characteristic can be obtained. Since the gate capacitance of the load inverter 33 and the wiring capacitance of the output terminal $0_1$ are contained in the load capacitance, the Schmitt circuit operates at high speed.

Figure 15A:
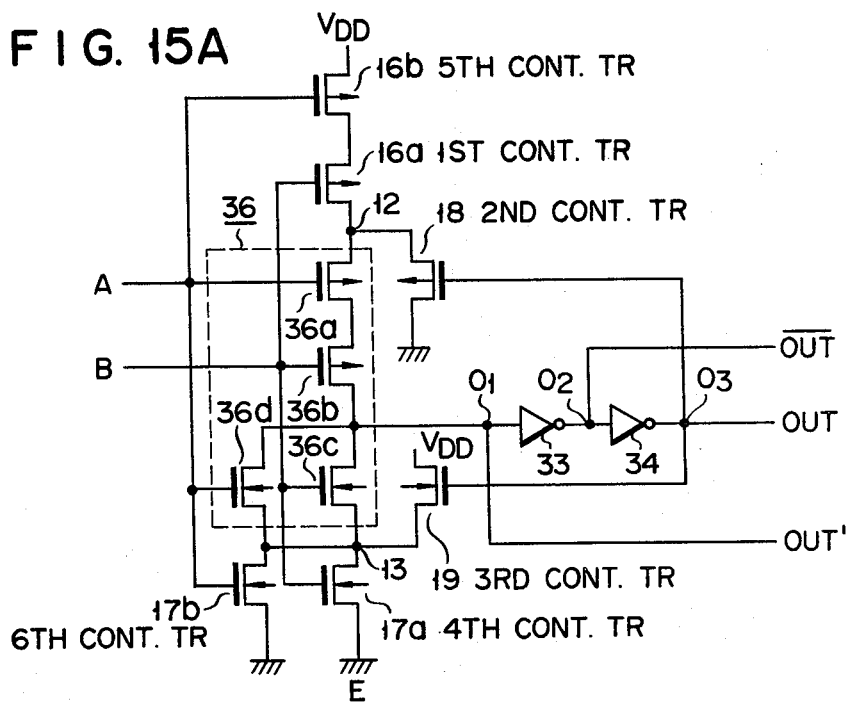
FIGS. 15A and 15B show a circuit diagram of an eighth embodiment of a logic circuit according to the present invention and a symbol for the circuit, respectively.
Figure 15B:
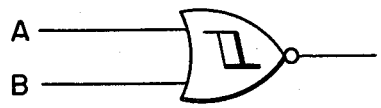

A logic circuit shown in FIG. 15A employs a NOR gate 36 in place of the inverter 11 shown in FIG. 13 and is expressed by a symbol shown in FIG. 15B, as a NOR circuit with a hysteresis characteristic. In FIG. 15A, the NOR gate 36 is constructed of P type transistors 36a and 36b, and the N type transistors 36c and 36d. The logic circuit is further provided with fifth (P type) and sixth (N type) bias control transistors 16b and 17b. As shown, the transistors 36a, 36b and 36c are inserted in series between the fifth bias control transistor 16b connected at the source to the first potential terminal $V_{DD}$ and the fourth bias control terminal 17a connected at the source to the second potential terminal E. The transistors 16b, 36d and 17b are connected together at the gates, and the drain-source paths of the transistors 36d and 17d are connected in series to each other. The output point $0_1$ of the NOR gate 36 is connected to the input terminal of the inverter 33 and the output point $0_2$ of the inverter 33 is connected to the input terminal of the inverter 34, and the output OUT is derived from the output terminal 0₃. The output OUT' and the output $\overline{OUT}$ are taken out from the output points 0₁ and 0₂ as required. A P type second bias control transistor 18 is connected between the first node 12 as a junction point between the transistor 36a and the first control transistor 16a and the second potential terminal E and the gate of the transistor 18 is connected to the output terminal 0₃. A third bias control transistor 19 is connected between a second node 13 as a junction point between the transistor 36c and the fourth bias control transistor 17a and the first potential point $V_{DD}$. The gate of the transistor 19 is connected to the output point 0₃. The transistor 36d and the sixth bias control transistor 17b are connected in series between the output point 0₁ of the NOR gate 36 and the second potential terminal E. The junction point in the series connection point is connected to the second node 13. The input A is connected to the gates of the bias control transistors 16d and 17b, and the gate of the transistor 36d. The second input B is connected to the gates of the first and fourth transistors 16a and 17a, and the gates of the transistors 36b and 36c.

Figure 16:
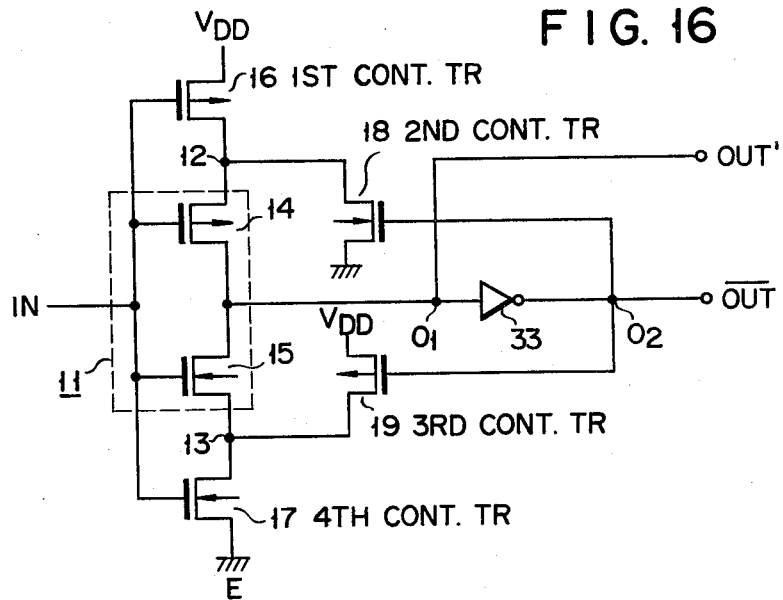
FIG. 16 is a circuit diagram of a ninth embodiment of a logic circuit according to the present invention.

A ninth embodiment shown in FIG. 16 is so arranged that the P type second bias control transistor 18 shown in FIG. 13 is replaced by an N type second bias control transistor 18 and the N type third bias control transistor 19 is replaced by a P type bias control transistor 19. In this arrangement, the load inverter 34 in FIG. 13 is omitted and the output at the output terminal 0₂ of the load inverter 33 is fed to the gates of the bias control transistors 18 and 19. Compared with the logic circuit shown in FIG. 13, a lesser number of the components are required for the logic circuit in FIG. 16, but the same effect can be attained.

A tenth embodiment shown in FIG. 17A uses an NAND gate 37 for the inverter 11 in FIG. 16. The NAND gate 37 contains the P type transistor 37a and 37d, and the N type transistors 37b and 37c. A P type first bias control transistor 16a, transistors 37a to 37c, an N type fourth bias control transistor 17a, and an N type sixth bias control transistor 17b are connected in series with the transistor 16a connected at the source to the first potential terminal $V_{DD}$ and the transistor 17b connected at the source to the second potential terminal E. A second bias control transistor 18 is connected between a first node 12 as a junction point of the first control transistor 16a to the transistor 37a and the second potential terminal E. A third bias control transistor 19 is connected between a second node 13 as a junction point of the fourth bias control transistor 17a to the transistor 37c and the first potential terminal E. The output point 0₁ of the NAND gate 37 is connected to the input of the inverter 33, and the output $\overline{OUT}$ is derived from the output point 0₂. The output OUT' may be derived from the output point 0₁ if necessary. The signal at the output terminal 0₂ is fed to the gates of the transistors 18 and 19. The transistor 37d and the P type fifth bias control transistor 16b are connected in series between the output terminal 0₁ and the first potential terminal $V_{DD}$. The first input A to the NAND gate 37 is supplied to the gates of the first bias control transistor 16a, the transistors 37a and 37b, and the fourth bias control transistor 17a. The second input B is supplied to the gates of the sixth bias control transistor 16b, the transistors 37c and 37d, and the sixth bias control transistor 17b.

In an eleventh embodiment shown in FIG. 18, the third and fourth bias control transistors 19 and 17 in the circuit shown in FIG. 13 are omitted and the source of the inverter transistor 15 is connected to the second potential terminal E. The symbols shown in FIG. 13 are used for designating the like portions and explanation of them is omitted.

Figure 19:
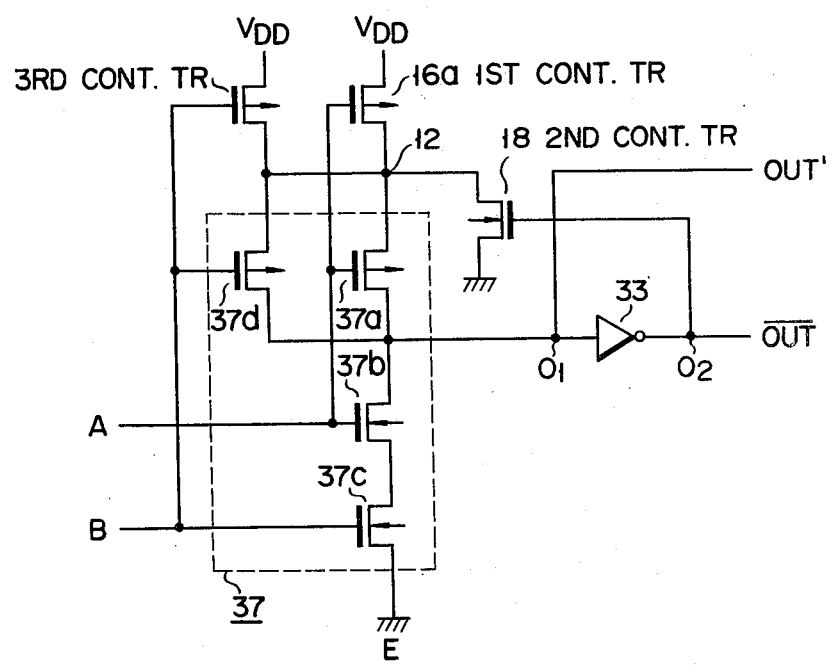

In a twelfth embodiment shown in FIG. 19, the third bias control transistor 19, fourth and sixth bias control transistors 17a and 17b in the circuit shown in FIG. 17A are omitted and the source of the transistor 37c in the NAND gate is directly connected to the second potential terminal E. No further explanation will be given with like symbols applied to the like portions in FIG. 17A.

Figure 20:
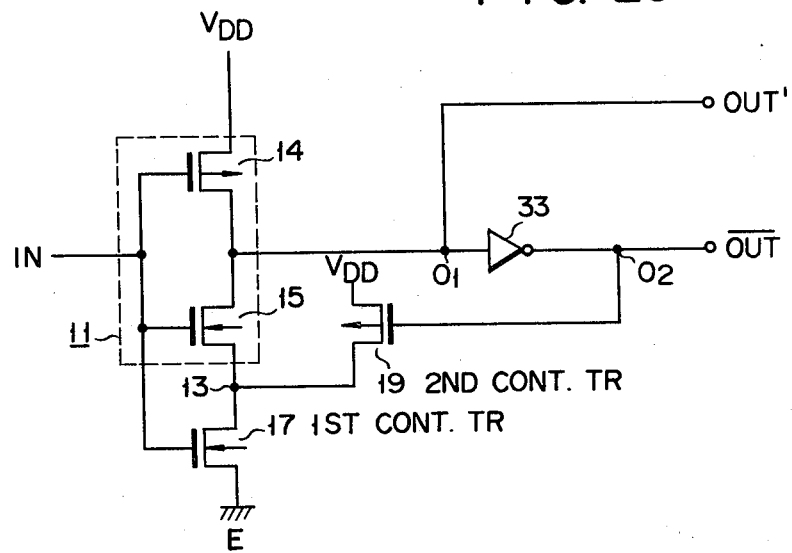

In a thirteen embodiment shown in FIG. 20, the first and second bias control transistors 16 and 18 in the circuit of FIG. 16 are omitted and the source of the transistor 14 making up the inverter 11 is directly connected to the potential terminal $V_{DD}$. In the arrangement, the potential terminals E and $V_{DD}$ are considered to be the first and second potential terminals.

It should be understood that the output threshold controllable type logic circuits are not limited to those shown in FIGS. 13, 15A, 16, 17A, 18 and 20. For example, the logic gate may be constructed of a combination of the MOS transistors of proper conductivity type, and not the CMOS transistors. The CMOS structure is not necessarily essential for constructing the transistors for controlling the biases of the nodes 12 and 13. In FIG. 13, the polarities of the bias control transistors 18 and 19 may be properly interchanged with each other and the voltage of the gate voltage may be selected properly. The modifications thereof are as described referring to FIGS. 4 to 6. The embodiments shown in FIGS. 18, 19 and 20 need lesser numbers of circuit components than the corresponding embodiments shown in FIGS. 6, 17A and 6, while securing the same effects.

What we claim is:
1. A logic circuit with a variable bias voltage logic gate section, said logic circuit comprising:
  an inverter which includes a first IGFET of a first conductivity type and a second IGFET of a second conductivity type each having a source, drain and gate, with said drains of said first and second IGFET's being coupled together to form an output terminal of said inverter and said gates of said first and second IGFET's being coupled together to form an input terminal of said inverter;
  an output terminal for said logic circuit;
  first and second load inverters connected in series between said output terminal of said inverter and said output terminal of said logic circuit;
  first and second power terminals;
  a first bias control IGFET of said first conductivity type which has a source-drain path connected between the source of said first IGFET and said first power terminal, and which has a gate connected to said input terminal of said inverter;
  a second bias control IGFET of said first conductivity type which has a source-drain path connected between said source of said first IGFET and said second power terminal, and which has a gate connected to the output of said second load inverter;
  a third bias control IGFET of said second conductivity type which has a source-drain path connected between the source of said second IGFET and said first power terminal, and which has a gate connected to said output of said second load inverter; and
  a fourth bias control IGFET of said second conductivity type which has a source-drain path connected between said source of said second IGFET and said second power terminal, and which has a gate connected to said input terminal of said inverter.

* * * * *